US012812953B2

(12) United States Patent
Willard

(10) Patent No.: US 12,812,953 B2
(45) Date of Patent: Nov. 24, 2026

(54) TRANSISTORS DESIGNED WITH REDUCED LEAKAGE

(71) Applicant: pSemi Corporation, San Diego, CA (US)

(72) Inventor: Simon Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 697 days.

(21) Appl. No.: 17/935,267

(22) Filed: Sep. 26, 2022

(65) Prior Publication Data

US 2024/0105793 A1 Mar. 28, 2024

(51) Int. Cl.

*H10D 30/63* (2025.01)
*H10D 64/01* (2025.01)
*H10D 64/27* (2025.01)
*H10D 86/00* (2025.01)

(52) U.S. Cl.

CPC ......... *H10D 64/516* (2025.01); *H10D 30/637* (2025.01); *H10D 64/01* (2025.01); *H10D 64/519* (2025.01); *H10D 86/201* (2025.01)

(58) Field of Classification Search

CPC .... H10D 64/516; H10D 30/637; H10D 64/01; H10D 64/519; H10D 86/201; H10D 30/6744; H10D 30/0323; H10D 30/6706; H10D 30/6758

See application file for complete search history.

(56) References Cited

U.S. PATENT DOCUMENTS

| | | | | |
|---|---|---|---|---|
| 7,361,556 | B2 | 4/2008 | Adkisson et al. | |
| 2003/0006463 | A1* | 1/2003 | Ichikawa ........... | H10D 30/6708 257/E29.147 |
| 2004/0155317 | A1 | 8/2004 | Bhattacharyya | |
| 2004/0217420 | A1* | 11/2004 | Yeo .................... | H10D 30/6213 257/E21.703 |
| 2017/0062616 | A1* | 3/2017 | Wu ...................... | H10D 30/024 |

FOREIGN PATENT DOCUMENTS

JP 2012060028 A * 3/2012

OTHER PUBLICATIONS

Translation of JP 2012060028 A (Hideki) (Year: 2012).*
Translation of JP 2012060028 A (Year: 2012).*
International Search Report and Written Opinion mailed Jan. 23, 2024, in counterpart PCT International Application No. PCT/US2023/075036, 13 pages.

* cited by examiner

*Primary Examiner* — William B Partridge
*Assistant Examiner* — Ilker Ozden
(74) *Attorney, Agent, or Firm* — Haynes and Boone, LLP

(57) ABSTRACT

Embodiments of the present disclosure provide devices, apparatuses, and methods related to FETs with reduced leakage. In some embodiments, devices on a silicon-on-insulator substrate may include a silicon layer; a gate structure at least partially overlaying the silicon layer; and an oxide layer disposed between the partial overlay of the gate structure and the silicon layer, wherein: the oxide layer comprises a first portion and a second portion; the first portion of the oxide layer is thicker than the second portion of the oxide layer; and the first portion of the oxide layer covers at least a portion of a first edge of the silicon layer in the partial overlay.

19 Claims, 4 Drawing Sheets

A – – – – – – – – – – – – A'

A - - - - - - - - - - - - - - A’

300

TRANSISTORS DESIGNED WITH REDUCED LEAKAGE

FIELD

The description herein relates to the field of integrated circuit (IC) field effect transistor (FET) designs, and more particularly to FETs designed with reduced leakage.

BACKGROUND

In the fabrication of integrated circuit (IC) field effect transistors (FET), silicon-on-insulator (SOI) substrates, rather than over bulk silicon substrates, may be used since SOI substrates results in higher speed, lower power consumption, improved radio frequency (RF) performance, and improved radiation resistance. FETs may have different voltage domains and logic that operate between a wide range of voltages.

SUMMARY

Embodiments of the present disclosure provide devices, apparatuses, and methods related to FETs with reduced leakage. In some embodiments, devices on a silicon-on-insulator substrate may include a silicon layer; a gate structure at least partially overlaying the silicon layer; and an oxide layer disposed between the partial overlay of the gate structure and the silicon layer, wherein: the oxide layer comprises a first portion and a second portion; the first portion of the oxide layer is thicker than the second portion of the oxide layer; and the first portion of the oxide layer covers at least a portion of a first edge of the silicon layer in the partial overlay.

In some embodiments, methods of forming a device on a silicon-on-insulator substrate may include providing a silicon layer; providing an oxide layer; and providing a gate structure at least partially overlaying the silicon layer, wherein: the oxide layer is disposed between the partial overlay of the gate structure and the silicon layer; the oxide layer comprises a first portion and a second portion; the first portion of the oxide layer is thicker than the second portion of the oxide layer; and the first portion of the oxide layer covers at least a portion of a first edge of the silicon layer in the partial overlay.

In some embodiments, silicon-on-insulator substrates may include a silicon layer; an oxide layer for receiving a portion of a gate structure, wherein: the oxide layer comprises a first portion and a second portion; the first portion of the oxide layer is thicker than the second portion of the oxide layer; and the first portion of the oxide layer covers at least a portion of a first edge of the silicon layer.

In some embodiments, devices on a silicon-on-insulator substrate may include a silicon island formed in a silicon layer; a first gate structure formed in an active region on the silicon island, the first gate structure comprising a first gate oxide layer with a first gate oxide layer thickness; and a second gate structure and a third gate structure each formed over an edge of the silicon island and each extending from the first gate structure, the second gate structure comprising a second gate oxide layer with a second gate oxide layer thickness and the third gate structure comprising a third gate oxide layer with a third gate oxide layer thickness, wherein the first gate oxide layer thickness is less than the second gate oxide layer thickness and less than the third gate oxide layer thickness.

In some embodiments, methods of forming a device on a silicon-on-insulator substrate may include providing a silicon layer; providing an active region in the silicon layer; providing a first gate oxide layer over at least one portion of a central region of the active region; providing a second gate oxide layer over at least one edge of the active region; providing a conductive gate material over the first gate oxide layer and the second gate oxide layer; and forming a gate structure overlaying the active region in the silicon layer, wherein: the gate structure extends across the active region, covering at least two edges and the at least one portion of the central region; and the first gate oxide layer is thinner than the second gate oxide layer.

DETAILED DESCRIPTION

Figure 1:
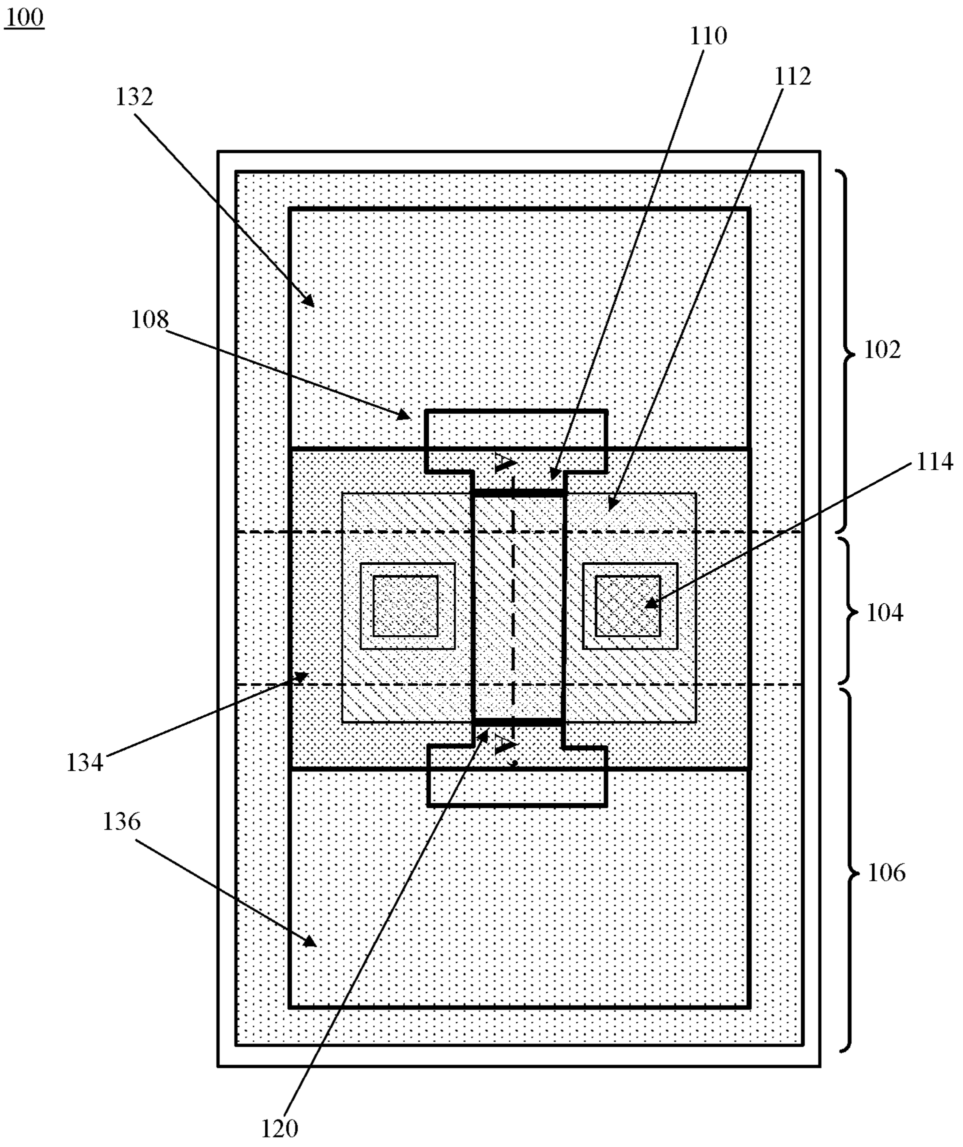
FIG. 1 is a top plan view of a layout of a transistor on an SOI substrate, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. Other features, objects, and advantages of the invention will be apparent from the description and drawings, and from the claims.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Devices with SOI substrates may use thin silicon for better switch performance, but thin silicon suffers from constraints in that it tends to reduce the threshold voltage of a device, thereby increasing current leakage. These effects increase towards edge regions of the thin silicon, where the thin silicon forms a "tip" (also known as a "bird's beak")

that is shaped by oxidation or a shallow trench isolation (STI) process during fabrication and is especially thin. This tip of the thin silicon has an especially low threshold voltage, thereby increasing current leakage of a device often called "edge leakage". In some cases, the threshold voltage of a tip of thin silicon may be as low as zero volts (V). The thickness of the thin silicon may also be reduced due to an oxygen diffusion path at the edge of and underneath the thin silicon. This oxygen diffusion may cause or form the tip or bird's beak of thin silicon. Moreover, the thickness of the thin silicon may be further reduced due to oxidation of the thin silicon from the gate oxide, thereby reducing the threshold voltage and increasing current leakage.

FETs may suffer from performance constraints if any current leakage occurs during operation of a device. For example, increased current leakage may increase the power consumption of a device. Therefore, a solution that satisfies the speed and current leakage requirements for transistors that operate over a wide range of voltages is needed to address the long-felt need of reduced current leakage in SOI, including, for example, radio frequency silicon-on-insulator (RFSOI) technology, and complementary metal oxide semiconductor (CMOS) transistors (e.g., bulk CMOS transistors).

These devices may be fabricated with thicker gate oxides to improve switch performance. However, using thicker gate oxides also suffers from drawbacks in that it degrades transistors. Moreover, oxidation from the gate oxide still reduces the thickness of the thin silicon. For example, in n-channel MOSFETs (NMOSFETs), the oxidation process that reduces the thickness of the thin silicon layer may deplete the dopants in the thin silicon, thereby further reducing the threshold voltage. The dopant depletion in the thin silicon reduces the threshold voltage due to the band gap at the edge regions of the thin silicon being bent downward. In p-channel MOSFETs (PMOSFETs), the oxidation process may further thin the thin silicon, thereby reducing the threshold voltage.

In some cases, the threshold voltage may be adjusted to help suppress current leakage by adjusting the doping type and dopant concentration under the gate. However, adjusting the doping type has some constraints in that a thick gate oxide may be used to reduce current leakage from the adjusted doping, but a device with a thin gate oxide may not be able to operate under the required voltage. Moreover, while using a thin gate oxide increases the drive current in a transistor, it also results in a faster increase in capacitance, thereby reducing the speed of the transistor.

In some cases, digital logic using transistors may use flared gates to increase the effective channel length at edge regions of the active thin silicon. However, flared gates increase the capacitance of a device, thereby reducing logic speed. Moreover, flared gates may be used in devices with thinner gate oxides in a dual-gate process, which further reduces logic speed due to the thinner oxide increasing capacitance.

Embodiments of the present disclosure provide devices, apparatuses, and methods that reduce current leakage and operate between a wide range of voltages at a high speed by providing a device (e.g., with an SOI substrate) with an increased threshold voltage. For example, some embodiments include a device with two dual-gate regions and an active region between the two dual-gate regions. In some embodiments, the gate oxide in the active region is thinner than the gate oxide in the dual-gate regions. The gate oxide may be thicker in the dual-gate regions since each dual-gate region may include edge regions of the silicon layer that are more susceptible to current leakage.

Some of the figures of this disclosure described below show NMOSFETs. However, the teachings of the invention may be applicable to PMOSFETs in some applications. Accordingly, the illustrated embodiments and example materials should not be taken as limitations on the scope of the invention. In some embodiments, to describe embodiments of the invention, a polysilicon gate structure and an oxide gate insulator may be used as an example, but other gate materials may be used to implement the invention.

Relative dimensions of components in drawings may be exaggerated for clarity. Within the following description of drawings, the same or like reference numbers refer to the same or like components or entities, and only the differences with respect to the individual embodiments are described.

FIG. 1 is a top plan view of a layout of a transistor fabricated on an SOI substrate, consistent with embodiments of the present disclosure.

In some embodiments, transistor 100 may include a first dual-gate region 102, a second dual-gate region 106, and a region 104 between first dual-gate region 102 and second dual-gate region 106. For example, region 104 may be an active region that is between dual-gate region 102 and dual-gate region 106 (e.g., region 104 is outside of dual-gate region 102 and outside of dual-gate region 106). In some embodiments, an island of active silicon layer 112 may be formed on an SOI substrate. A gate structure 108 including an insulator (e.g., an oxide layer) and overlaying gate material (e.g., polysilicon, conductive material, etc.) may be formed at least partially over silicon layer 112 (e.g., gate structure 108 may at least partially overlay silicon layer 112). In some embodiments, silicon layer 112 may include one or more contacts 114. In some embodiments, transistor 100 may include P+ implant region 132, N+ implant region 134 that overlaps silicon layer 112, and P+ implant region 136.

In some embodiments, silicon layer 112 may be a thin silicon layer to improve switch performance. In some embodiments, an oxide layer may be disposed between the overlay of gate structure 108 and silicon layer 112.

Figure 2:
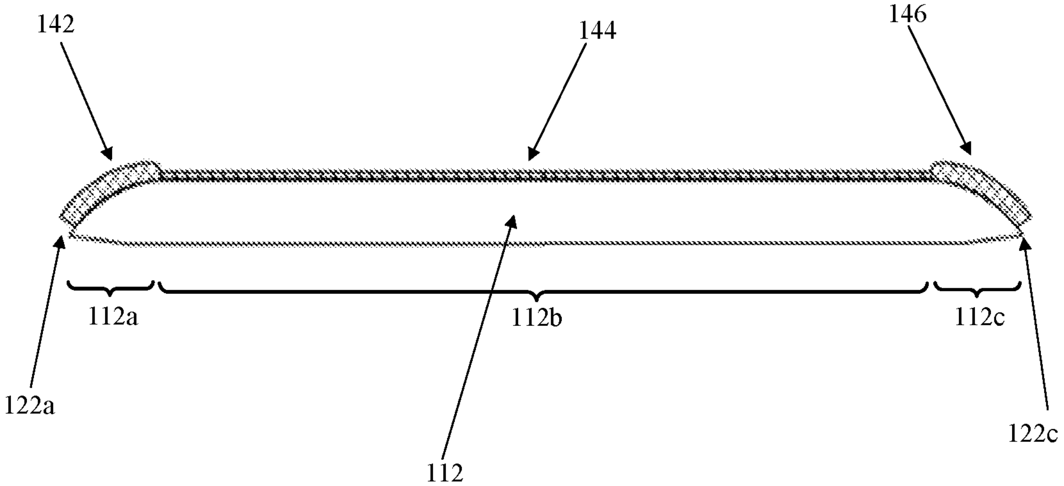
FIG. 2 is a cross-sectional view of an edge region of a transistor fabricated on an SOI substrate, consistent with embodiments of the present disclosure.

For illustrative purposes, a cross-sectional view of silicon layer 112 and the oxide layer along A-A' is provided in FIG. 2. It should be understood that other layers or components may exist around silicon layer 112 and the oxide layer, but are not shown in FIG. 2 for illustrative purposes. As shown in FIG. 2, oxidation or a STI process during fabrication may shape silicon layer 112 to form a tip **122*a* and a tip 122*c* that are especially thin. Tips 122*a* and 122*c* of silicon layer 112 each have an especially low threshold voltage, thereby increasing current leakage of a device. For example, a thickness of a portion 112*a* of silicon layer 112 at an edge of silicon layer 112 in a dual-gate region (e.g., dual-gate region 102 or dual-gate region 106 of FIG. 1 or dual-gate region 302 or 306 of FIG. 3) may be less than a thickness of a portion 112*b* of silicon layer 112 in an active region (e.g., region 104 of FIG. 1 or region 304 of FIG. 3**).

In order to increase the threshold voltage and reduce the current leakage of a transistor, a first portion 142 of an oxide layer in a dual-gate region may be thicker than a second portion 144 of the oxide layer in an active region. First portion 142 of the oxide layer may be thicker in dual-gate regions since each dual-gate region may include edges of silicon layer 112 that are more susceptible to current leakage, as described above. Since higher conduction may be needed in an active region and there is reduced drive current in the active region, second portion 144 of the oxide layer may be thinner in the active region. In some embodiments, second portion 144 of the oxide layer may cover at least a portion of silicon layer 112 in the partial overlay of gate structure 108. In some embodiments, second portion 144 of the oxide layer may cover an entirety of silicon layer 112 in region 104.

First portion 142 of the oxide layer in the dual-gate regions may also increase the threshold voltage in tip 122*a* of silicon layer 112 that is formed in the edges of silicon layer 112. That is, first portion 142 of the oxide layer may be formed on tip 122*a* of silicon layer 112, thereby making tips 122 more robust to oxide breakdown and reducing current leakage at tip 122*a*. Therefore, first portion 142 of the oxide layer may be configured to reduce current leakage in edge transistors of a transistor.

In some embodiments, the partial overlay of gate structure 108 and silicon layer 112 may include a first edge and a second edge of silicon layer 112 in the at least partial overlay of gate structure 108. In some embodiments, first portion 142 of the oxide layer may cover at least a portion of the first edge of silicon layer 112. In some embodiments, first portion 142 of the oxide layer may cover an entirety of silicon layer 112 in dual-gate region 102 (e.g., first portion 142 of the oxide layer may cover silicon layer 112 in dual-gate region 102 where gate structure 108 at least partially overlays silicon layer 112 and where gate structure 108 does not overlay silicon layer 112). In some embodiments, first portion 142 of the oxide layer, the first edge of silicon layer 112, and the portion of gate structure 108 on the first edge of silicon layer 112 may define edge transistor 110.

In some embodiments, the oxide layer may include a third portion 146, similar to first portion 142, that may cover at least a portion of the second edge of silicon layer 112. Similar to portion 112*a* of silicon layer 112, a thickness of a portion 112*c* of silicon layer 112 at an edge of silicon layer 112 in a dual-gate region (e.g., dual-gate region 106 or dual-gate region 102 of FIG. 1 or dual gate regions 306 or 302 of FIG. 3) may be less than a thickness of portion 112*b* of silicon layer 112 in an active region. In some embodiments, in order to increase the threshold voltage and reduce the current leakage of a transistor, third portion 146 of the oxide layer in the dual-gate region may be thicker than second portion 144 of the oxide layer in an active region. Third portion 146 of the oxide layer may be thicker in dual-gate regions since each dual-gate region may include edges of silicon layer 112 that are more susceptible to current leakage, as described above.

Third portion 146 of the oxide layer in the dual-gate regions may also increase the threshold voltage in tip 122*c* of silicon layer 112 that is formed in the edges of silicon layer 112. That is, third portion 146 of the oxide layer may be formed on tip 122*c* of silicon layer 112, thereby making tip 122*c* more robust to oxide breakdown and reducing current leakage at tip 122*c*. Therefore, third portion 146 of the oxide layer may be configured to reduce current leakage in edge transistors of a transistor.

In some embodiments, third portion 146 of the oxide layer may cover an entirety of silicon layer 112 in dual-gate region 106 (e.g., the third portion of the oxide layer may cover silicon layer 112 in dual-gate region 106 where gate structure 108 at least partially overlays silicon layer 112 and where gate structure 108 does not overlay silicon layer 112). In some embodiments, third portion 146 of the oxide layer, the second edge of silicon layer 112, and the portion of gate structure 108 on the second edge of silicon layer 112 may define an edge transistor 120. That is, for purposes of this disclosure, edge transistors 110 and 120 may be indicated by bold lines in FIG. 1. Therefore, the thick portions of the oxide layer (e.g., first portion 142 and third portion 146 of FIG. 2) may increase the threshold voltage of and reduce current leakage in edge transistors 110 and 120. For example, the threshold voltage of each of edge transistors 110 and 120 may be increased to greater than 0 V. In some embodiments, the threshold voltage of each of edge transistors 110 and 120 may be increased such that they are greater than threshold voltages of edge transistors 110 and 120 with a thinner oxide layer (e.g., the threshold voltages of edge transistors 110 and 120 are greater with first portion 142 and third portion 146 than with an oxide layer that is thinner than first portion 142 and third portion 146).

In some embodiments, the dopant concentration in implant region 134 in active region 104 may be higher than implant regions 132 and 136 in dual-gate regions 102 and 106 so that the threshold voltage in all regions may be high, thereby reducing current leakage.

In some SOI processes, a device may have the same well for thin oxide regions and thick oxide regions, but different Lightly Doped Drains (LDDS) and halos for the thin oxide regions and thick oxide regions. In some embodiments consistent with the current disclosure, different wells may be used for thin oxide regions and thick oxide regions, but the same LDDs and halos may be used in the thin oxide regions and thick oxide regions. In some embodiments, when the well doping of a thin oxide region is much higher than the well doping of a thick oxide region, the thick oxide region may have a higher threshold voltage at edge regions to reduce current leakage. In some embodiments, the threshold voltage and current leakage at edge regions may depend on the amount of well doping and the thickness of the oxide (e.g., high well doping and thicker oxide may increase the threshold voltage at edge regions to reduce current leakage).

Embodiments where the same LDDs and halos are formed in the thin oxide region and in the thick oxide region may be advantageous since the only major process adjustment is adjusting the oxide thickness. These embodiments may also be advantageous in that it avoids misalignment that can sometimes occur when different LDDs and halos are formed in the thin oxide region and the thick oxide region.

Figure 3:
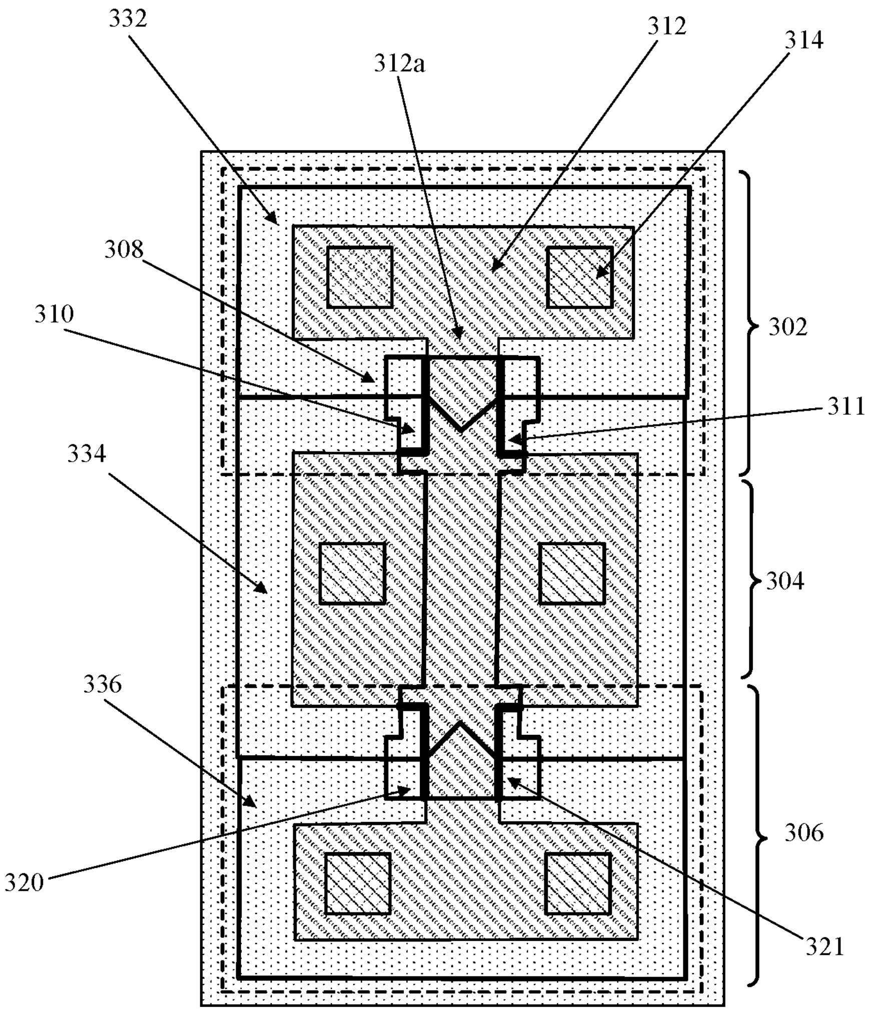
FIG. 3 is a top plan view of a layout of a transistor fabricated on an SOI substrate, consistent with embodiments of the present disclosure.

FIG. 3 is a top plan view of a layout of a transistor fabricated on an SOI substrate, consistent with embodiments of the present disclosure. It should be understood that FIG. 3 may be designed and operated in a manner similar to FIG. 1 and FIG. 2 described above.

In some embodiments, transistor 300 may include a first dual-gate region 302, a second dual-gate region 306, and a region 304 between first dual-gate region 302 and second dual-gate region 306. For example, region 304 may be an active region that is between dual-gate region 302 and dual-gate region 306 (e.g., region 304 is outside of dual-gate region 302 and outside of dual-gate region 306). In some embodiments, an active silicon layer 312 may be formed on an SOI substrate. A gate structure 308 including an insulator (e.g., an oxide layer) and overlaying gate material (e.g., polysilicon, conductive material, etc.) may be formed at least partially over silicon layer 312 (e.g., gate structure 308 may at least partially overlay silicon layer 312). In some embodiments, silicon layer 312 may include one or more contacts 314. In some embodiments, P+ implant region 332, N+ implant region 334, and P+ implant region 336 may overlap silicon layer 312.

In some embodiments, silicon layer 312 may be a thin silicon that results in improved switch performance. In some embodiments, an oxide layer may be disposed between the overlay of gate structure 308 and silicon layer 312.

In some embodiments, the at least partial overlay of gate structure 308 and silicon layer 312 may include a first edge, a second edge, a third edge, and a fourth edge of silicon layer 312 in the at least partial overlay of gate structure 308. In some embodiments, a first portion (e.g., first portion 142 of FIG. 2) of the oxide layer may cover at least a portion of the first edge and the second edge of silicon layer 312. In some embodiments, the first portion of the oxide layer may cover an entirety of silicon layer 312 in dual-gate region 302 (e.g., the first portion of the oxide layer may cover silicon layer 312 in dual-gate region 302 where gate structure 308 at least partially overlays silicon layer 312 and where gate structure 308 does not overlay silicon layer 312). In some embodiments, the first portion of the oxide layer, the first edge, and the portion of gate structure 308 on the first edge may define edge transistor 310. In some embodiments, the first portion of the oxide layer, the second edge, and the portion of gate structure 308 on the second edge may define edge transistor 311.

In some embodiments, the oxide layer may include a third portion (e.g., third portion 146 of FIG. 2), similar to the first portion, that may cover at least a portion of the third edge and the fourth edge of silicon layer 312. In some embodiments, the third portion of the oxide layer may cover an entirety of silicon layer 312 in dual-gate region 306 (e.g., the third portion of the oxide layer may cover silicon layer 312 in dual-gate region 306 where gate structure 308 at least partially overlays silicon layer 312 and where gate structure 308 does not overlay silicon layer 312). In some embodiments, the third portion of the oxide layer, the third edge of silicon layer 312, and the portion of gate structure 308 on the third edge of silicon layer 312 may define edge transistor 320. In some embodiments, the fourth portion of the oxide layer, the fourth edge of silicon layer 312, and the portion of gate structure 308 on the fourth edge of silicon layer 312 may define edge transistor 321. That is, for purposes of this disclosure, edge transistors 310, 311, 320, and 321 may be indicated by bold lines in FIG. 3.

In order to increase the threshold voltage and reduce the current leakage of a transistor, a first portion the oxide layer in dual-gate regions 302 and 306 may be thicker than a second portion of the oxide layer (e.g., second portion 144 of FIG. 2) in an active region 304. The first portion of the oxide layer may be thicker in dual-gate regions 302 and 306 since each dual-gate region may include edges of silicon layer 312 that are more susceptible to current leakage, as described above. Since higher conduction may be needed in an active region and there is reduced drive current in the active region, the second portion of the oxide layer may be thinner in the active region. In some embodiments, the second portion of the oxide layer may cover at least a portion of silicon layer 312 in the at least partial overlay of gate structure 308. In some embodiments, the second portion of the oxide layer may cover an entirety of silicon layer 312 in region 304.

The first portion of the oxide layer in dual-gate regions 302 and 306 may also increase the threshold voltage in the tips (e.g., tips 122*a* or 122*c* of FIG. 2) of silicon layer 312 that is formed in the edges of silicon layer 312. That is, the first portion of the oxide layer may be formed on the tips of silicon layer 312, thereby making the tips 322 more robust to oxide breakdown and reducing current leakage at the tips. Therefore, the first portion of the oxide layer may be configured to reduce current leakage in edge transistors 310, 311, 320, and 321 of a transistor. For example, the threshold voltage of each of edge transistors 310, 311, 320, and 321 may be increased to greater than 0 V. In some embodiments, the threshold voltage of each of edge transistors 310, 311, 320, and 321 may be increased such that they are greater than threshold voltages of edge transistors 310, 311, 320, and 321 with a thinner oxide layer (e.g., the threshold voltages of edge transistors 310, 311, 320, and 321 are greater with a thicker oxide layer than with a thinner oxide layer).

In some embodiments, gate structure 308 may be modified to increase or "flare" the effective channel length of edge transistors 310, 311, 320, and 321 relative to the length of the central conduction channel of transistor 300 (e.g., gate structure 308 may be flared in dual-gate region 302 and in dual-gate region 306). The increased edge transistor channel length results in a further reduction of leakage current. While the flared shape of gate structure 308 increases its capacitance, thereby reducing logic speed, the thick portions of the oxide layer under the flared portions of gate structure 308 reduces the capacitance of gate structure 308, thereby increasing logic speed.

In some embodiments, silicon layer 312 may be body-tied (e.g., rather than a floating body like silicon layer 112 of FIG. 1), where silicon layer 312 includes a narrow neck shape (e.g., body tie) 312*a* to reduce the amount of active silicon on a device, thereby minimizing or reducing wasted area or capacitance overhead.

In some SOI processes, a device may have the same well for thin oxide regions and thick oxide regions, but different LDDs and halos for the thin oxide regions and thick oxide regions. In some embodiments consistent with the current disclosure, different wells may be used for thin oxide regions and thick oxide regions, but the same LDDs and halos may be used in the thin oxide regions and thick oxide regions. Since the well doping of a thin oxide region is much higher than the well doping of a thick oxide region, the thick oxide region will have a higher threshold voltage at edge regions to reduce current leakage.

Embodiments where the same LDDs and halos are formed in the thin oxide region and in the thick oxide region may be advantageous since the only major process adjustment is adjusting the oxide thickness. These embodiments may also be advantageous in that it avoids misalignment that can sometimes occur when different LDDs and halos are formed in the thin oxide region and the thick oxide region.

Figure 4:
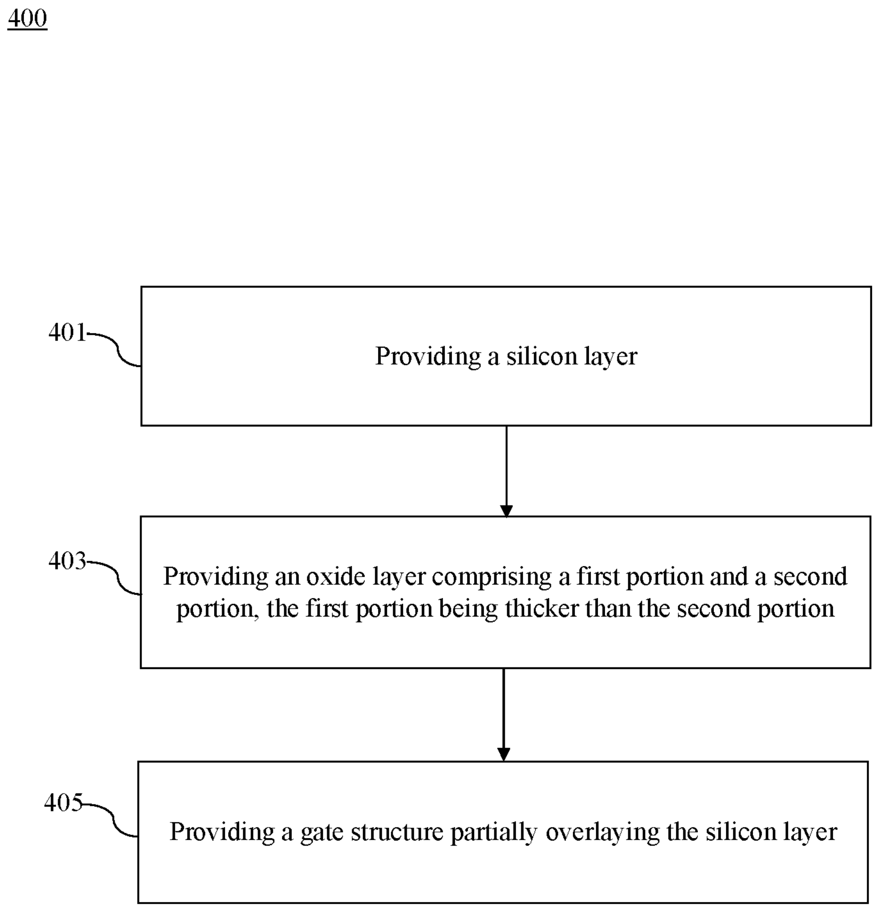
FIG. 4 illustrates a flowchart representing an exemplary method of forming a transistor on an SOI substrate, consistent with embodiments of the present disclosure.

FIG. 4 illustrates a flowchart representing an exemplary method 400 of forming a transistor on an SOI substrate, consistent with embodiments of the present disclosure.

At step 401, a silicon layer (e.g., silicon layer 112 of FIG. 1, silicon layer 112 of FIG. 2, or silicon layer 312 of FIG. 3) may be provided (e.g., formed) on an SOI substrate. In some embodiments, the silicon layer may be a thin silicon layer to improve switch performance. In some embodiments, the silicon layer (e.g., silicon layer 312 of FIG. 3) may be body-tied (e.g., rather than a floating body like silicon layer 112 of FIG. 1), where the silicon layer includes a narrow neck shape (e.g., body tie 312*a* of FIG. 3) to reduce the amount of active silicon on a device, thereby minimizing or reducing wasted area or capacitance overhead.

At step 403, an oxide layer may be provided. In some embodiments, the oxide layer may be disposed between the at least partial overlay of the gate structure and the silicon layer. In some embodiments, the at least partial overlay may include a first region (e.g., dual-gate region 102 of FIG. 1 or dual-gate region 302 of FIG. 3) and a second region (e.g., region 104 of FIG. 1 or region 304 of FIG. 3). In some embodiments, the oxide layer may include a first portion (e.g., first portion 142 of FIG. 2) and a second portion (e.g., second portion 144 of FIG. 2). In some embodiments, the first portion of the oxide layer may be in the first region and the second portion of the oxide layer may be in the second region. In some embodiments, the first portion of the oxide layer may be thicker than the second portion of the oxide layer. In some embodiments, the first portion of the oxide layer may cover at least a portion of a first edge and/or a second edge of the silicon layer in the at least partial overlay. In some embodiments, the first portion of the oxide layer, the first edge of the silicon layer, and the gate structure on the first edge may define a first edge transistor (e.g., edge transistors 110 or 120 of FIG. 1 or edge transistors 310, 311, 320, or 321 of FIG. 3). In some embodiments, the first portion of the oxide layer, the second edge of the silicon layer, and the gate structure on the second edge may define a second edge transistor (e.g., edge transistors 110 or 120 of FIG. 1 or edge transistors 310, 311, 320, or 321 of FIG. 3).

In some embodiments, the first portion of the oxide layer may cover an entirety of the silicon layer in the first region (e.g., the first portion of the oxide layer may cover the silicon layer in a dual-gate region where the gate structure at least partially overlays the silicon layer and where the gate structure does not overlay the silicon layer). In some embodiments, the oxide layer may include a third portion, similar to the first portion, that may cover at least a portion of a third edge and a fourth edge of the silicon layer. In some embodiments, the third portion of the oxide layer may cover an entirety of the silicon layer in a third region (e.g., the third portion of the oxide layer may cover the silicon layer in a dual-gate region where the gate structure at least partially overlays the silicon layer and where the gate structure does not overlay the silicon layer). In some embodiments, the third portion of the oxide layer, the third edge and/or the fourth edge of the silicon layer, and the portion of the gate structure on the third edge and/or the fourth edge of the silicon layer may define edge transistor(s) (e.g., edge transistors 310, 311, 320, or 321 of FIG. 3).

In order to increase the threshold voltage and reduce the current leakage of a transistor, the first portion and the third portion of the oxide layer in the dual-gate regions may be thicker than a second portion of the oxide layer in the active region. The first portion and the third portion of the oxide layer may be thicker in the dual-gate regions since each dual-gate region may include edges of the silicon layer that are more susceptible to current leakage, as described above. Since higher conduction may be needed in an active region and there is no drive current in the active region, the second portion of the oxide layer may be thinner in the active region. In some embodiments, the second portion of the oxide layer may cover at least a portion of the silicon layer in the at least partial overlay of the gate structure. In some embodiments, the second portion of the oxide layer may cover an entirety of the silicon layer in the active region.

The first portion and the third portion of the oxide layer in the dual-gate regions may also increase the threshold voltage in the tips (e.g., tips 122*a* or 122*c* of FIG. 2) of the silicon layer that is formed in the edges of the silicon layer. That is, the first portion and the third portion of the oxide layer may be formed on the tips of the silicon layer, thereby making the tips more robust to oxide breakdown and reducing current leakage at the tips. Therefore, the first portion of the oxide layer may be configured to reduce current leakage in the edge transistors of a transistor. For example, the threshold voltage of edge transistors may be increased to greater than 0 V. In some embodiments, the threshold voltage of edge transistors may be increased such that they are greater than threshold voltages of edge transistors with a thinner oxide layer (e.g., the threshold voltages of edge transistors 110 and 120 are greater with first portion 142 and third portion 146 than with an oxide layer that is thinner than first portion 142 and third portion 146).

At step 405, a gate structure (e.g., gate structure 108 of FIG. 1 or gate structure 308 of FIG. 3) at least partially overlaying the silicon layer may be provided. In some embodiments, the gate structure (e.g., gate structure 308 of FIG. 3) may be modified to increase or "flare" the effective channel length of edge transistors (e.g., edge transistors 310, 311, 320, and 321 of FIG. 3) relative to the length of the central conduction channel of the transistor (e.g., gate structure 308 may be flared in dual-gate region 302 and in dual-gate region 306). The increased edge transistor channel length results in a further reduction of leakage current. While the flared shape of the gate structure increases its capacitance, thereby reducing logic speed, the thick portions of the oxide layer under the flared portions of the gate structure reduces the capacitance of the gate structure, thereby increasing logic speed.

The embodiments may further be described using the following clauses:

1. A device on a silicon-on-insulator substrate, comprising:
   - a silicon layer;
   - a gate structure at least partially overlaying the silicon layer; and
   - an oxide layer disposed between the partial overlay of the gate structure and the silicon layer, wherein:
     - the oxide layer comprises a first portion and a second portion;
     - the first portion of the oxide layer is thicker than the second portion of the oxide layer; and
     - the first portion of the oxide layer covers at least a portion of a first edge of the silicon layer in the partial overlay.
2. The device of clause 1, wherein the first portion of the oxide layer covers an entirety of the first edge of the silicon layer.
3. The device of clause 1, wherein the gate structure is flared.
4. The device of clause 1, wherein a thickness of the silicon layer under the first portion of the oxide layer is less than a thickness of the silicon layer under the second portion of the oxide layer.
5. The device of clause 1, wherein the second portion of the oxide layer is in an active region.
6. The device of clause 1, wherein the first portion of the oxide layer, the first edge of the silicon layer, and the gate structure on the first edge defines a first edge transistor.
7. The device of clause 6, wherein the first edge transistor comprises a threshold voltage greater than zero volts.
8. The device of clause 6, wherein the first edge transistor comprises a threshold voltage greater than a threshold voltage of a transistor with an oxide layer thickness less than the thickness of the first portion of the oxide layer.
9. The device of clause 1, wherein the first portion of the oxide layer is in a first dual-gate region.
10. The device of clause 9, wherein:
    - the oxide layer comprises a third portion,
    - the third portion of the oxide layer covers at least a portion of a second edge of the silicon layer in the partial overlay, and
    - the third portion of the oxide layer, the second edge of the silicon layer, and the gate structure on the second edge defines a second edge transistor.

11. The device of clause 10, wherein a thickness of the silicon layer under the third portion of the oxide layer is less than a thickness of the silicon layer under the second portion of the oxide layer.

12. The device of clause 10 wherein the third portion of the oxide layer covers an entirety of the second edge of the silicon layer.

13. The device of clause 10, wherein the third portion of the oxide layer is thicker than the second portion of the oxide layer.

14. The device of clause 13, wherein the third portion of the oxide layer is in a second dual-gate region.

15. The device of clause 14, wherein the second portion of the oxide layer is outside of the first dual-gate region and outside of the second dual-gate region.

16. The device of clause 14, wherein the second portion of the oxide layer is between the first portion of the oxide layer and the third portion of the oxide layer.

17. A method of forming a device on a silicon-on-insulator substrate, comprising:
- providing a silicon layer;
- providing an oxide layer; and
- providing a gate structure at least partially overlaying the silicon layer, wherein:
  - the oxide layer is disposed between the partial overlay of the gate structure and the silicon layer;
  - the oxide layer comprises a first portion and a second portion;
  - the first portion of the oxide layer is thicker than the second portion of the oxide layer; and
  - the first portion of the oxide layer covers at least a portion of a first edge of the silicon layer in the partial overlay.

18. The method of clause 17, wherein the first portion of the oxide layer covers an entirety of the first edge of the silicon layer.

19. The method of clause 17, wherein the gate structure is flared.

20. The method of clause 17, wherein a thickness of the silicon layer under the first portion of the oxide layer is less than a thickness of the silicon layer under the second portion of the oxide layer.

21. The method of clause 17, wherein the second portion of the oxide layer is in an active region.

22. The method of clause 17, wherein the first portion of the oxide layer, the first edge of the silicon layer, and the gate structure on the first edge defines a first edge transistor.

23. The method of clause 22, wherein the first edge transistor comprises a threshold voltage greater than zero volts.

24. The method of clause 22, wherein the first edge transistor comprises a threshold voltage greater than a threshold voltage of a transistor with an oxide layer thickness less than the thickness of the first portion of the oxide layer.

25. A silicon-on-insulator substrate, comprising:
- a silicon layer;
- an oxide layer for receiving a portion of a gate structure, wherein:
  - the oxide layer comprises a first portion and a second portion;
  - the first portion of the oxide layer is thicker than the second portion of the oxide layer; and
  - the first portion of the oxide layer covers at least a portion of a first edge of the silicon layer.

26. A device on a silicon-on-insulator substrate, comprising:
- a silicon island formed in a silicon layer;
- a first gate structure formed in an active region on the silicon island, the first gate structure comprising a first gate oxide layer with a first gate oxide layer thickness; and
- a second gate structure and a third gate structure each formed over an edge of the silicon island and each extending from the first gate structure, the second gate structure comprising a second gate oxide layer with a second gate oxide layer thickness and the third gate structure comprising a third gate oxide layer with a third gate oxide layer thickness,
- wherein the first gate oxide layer thickness is less than the second gate oxide layer thickness and less than the third gate oxide layer thickness.

27. A method of forming a device on a silicon-on-insulator substrate, comprising:
- providing a silicon layer;
- providing an active region in the silicon layer;
- providing a first gate oxide layer over at least one portion of a central region of the active region;
- providing a second gate oxide layer over at least one edge of the active region;
- providing a conductive gate material over the first gate oxide layer and the second gate oxide layer; and
- forming a gate structure overlaying the active region in the silicon layer, wherein:
  - the gate structure extends across the active region, covering at least two edges and the at least one portion of the central region; and
  - the first gate oxide layer is thinner than the second gate oxide layer.

It will be appreciated that the embodiments of the present disclosure are not limited to the exact construction that has been described above and illustrated in the accompanying drawings, and that various modifications and changes may be made without departing from the scope thereof.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Programmed Embodiments

Some or all aspects of the invention may be implemented in hardware or software, or a combination of both (e.g., programmable logic arrays). Unless otherwise specified, the methods included as part of the invention are not inherently related to any particular computer or other apparatus. In particular, various general purpose computing machines may be used with programs written in accordance with the teachings herein, or it may be more convenient to use a special purpose computer or special-purpose hardware (such as integrated circuits) to perform particular functions. Thus, embodiments of the invention may be implemented in one or more computer programs (i.e., a set of instructions or codes) executing on one or more programmed or programmable computer systems (which may be of various architectures, such as distributed, client/server, or grid) each comprising at least one processor, at least one data storage system (which may include volatile and non-volatile memory and/or storage elements), at least one input device or port, and at least one output device or port. Program instructions or code are applied to input data to perform the functions described herein and generate output information. The output information is applied to one or more output devices, in known fashion.

Each such computer program may be implemented in any desired computer language (including machine, assembly, or high level procedural, logical, object oriented programming languages or a custom language/script) to communicate with a computer system, and may be implemented in a distributed manner in which different parts of the computation specified by the software are performed by different processors. In any case, the computer language may be a compiled or interpreted language. Computer programs implementing some or all of the invention may form one or more modules of a larger program or system of programs. Some or all of the elements of the computer program can be implemented as data structures stored in a computer readable medium or other organized data conforming to a data model stored in a data repository.

Each such computer program may be stored on or downloaded to (for example, by being encoded in a propagated signal and delivered over a communication medium such as a network) a tangible, non-transitory storage media or device (e.g., solid state memory media or devices, or magnetic or optical media) for a period of time (e.g., the time between refresh periods of a dynamic memory device, such as a dynamic RAM, or semi-permanently, or permanently), the storage media or device being readable by a general or special purpose programmable computer for configuring and operating the computer when the storage media or device is read by the computer system to perform the procedures described above. The inventive system may also be considered to be implemented as a non-transitory computer-readable storage medium, configured with a computer program, where the storage medium so configured causes a computer system to operate in a specific or predefined manner to perform the functions described above.

What is claimed is:

1. A silicon-on-insulator transistor, comprising:

a silicon layer including a channel region having a width extending from a first edge of the silicon layer to a second edge of the silicon layer;

a gate structure overlaying the channel region; and a gate oxide layer disposed between the gate structure and the silicon layer, wherein the gate oxide layer comprises a first portion extending along the first edge of the silicon layer, a second portion extending from the first portion across the width of the channel region to a third portion extending along the second edge of the silicon layer, wherein the first portion and the third portion each has a substantially uniform first thickness that is greater than a substantially uniform second thickness of the second portion, and wherein the first portion of the gate oxide layer covers an entirety of the first edge of the silicon layer.

2. The silicon-on-insulator transistor of claim 1, wherein the gate structure is flared.

3. The silicon-on-insulator transistor of claim 1, wherein the second portion of the gate oxide layer is in an active region.

4. The silicon-on-insulator transistor of claim 1, wherein the first portion of the gate oxide layer, the first edge of the silicon layer, and the gate structure on the first edge defines a first edge transistor.

5. The silicon-on-insulator transistor of claim 4, wherein a threshold voltage of the first edge transistor is greater than zero volts.

6. The silicon-on-insulator transistor of claim 4, wherein a threshold voltage of the first edge transistor is greater than a threshold voltage of a transistor with a gate oxide layer thickness that is less than the first thickness.

7. The silicon-on-insulator transistor of claim 1, wherein the first portion of the gate oxide layer is in a first dual-gate region.

8. The silicon-on-insulator transistor of claim 7, wherein:

the third portion of the gate oxide layer, the second edge of the silicon layer, and the gate structure on the second edge defines a second edge transistor.

9. The silicon-on-insulator transistor of claim 8 wherein the third portion of the gate oxide layer covers an entirety of the second edge of the silicon layer.

10. The silicon-on-insulator transistor of claim 7, wherein the third portion of the gate oxide layer is in a second dual-gate region.

11. The silicon-on-insulator transistor of claim 10, wherein the second portion of the gate oxide layer is outside of the first dual-gate region and outside of the second dual-gate region.

12. The silicon-on-insulator transistor of claim 10, wherein the second portion of the gate oxide layer is between the first portion of the gate oxide layer and the third portion of the gate oxide layer.

13. A method of forming a silicon-on-insulator transistor, comprising:

providing a silicon layer having a channel region, wherein the channel region has a width extending from a first edge of the silicon layer to a second edge of the silicon layer;

providing a gate oxide layer; and providing a gate structure at least partially overlaying the silicon layer, wherein:

the gate oxide layer is disposed between the partial overlay of the gate structure and the silicon layer; and the gate oxide layer comprises a first portion extending along the first edge of the silicon layer, a second portion extending from the first portion across the width of the channel region to a third portion extending along the second edge of the silicon layer, wherein the first portion and the third portion each has a substantially uniform first thickness that is greater than a substantially uniform second thickness of the second portion, and wherein the first portion of the gate oxide layer covers an entirety of the first edge of the silicon layer.

14. The method of claim 13, wherein the gate structure is flared.

15. The method of claim 13, wherein the second portion of the gate oxide layer is in an active region.

16. The method of claim 13, wherein the first portion of the gate oxide layer, the first edge of the silicon layer, and the gate structure on the first edge defines a first edge transistor.

17. The method of claim 16, wherein a threshold voltage of the first edge transistor is greater than zero volts.

18. The method of claim 16, wherein a threshold voltage of the first edge transistor is greater than a threshold voltage of a transistor with a gate oxide layer having a thickness that is less than the first thickness.

19. A silicon-on-insulator transistor, comprising:

a silicon layer having a channel region, wherein the channel region has a width extending from a first edge of the silicon layer to a second edge of the silicon layer; and a gate oxide layer for receiving a portion of a gate structure, wherein:

the gate oxide layer comprises a first portion extending along the first edge of the silicon layer, a second portion extending from the first portion across the width of the channel region to a third portion extending along the second edge of the silicon layer, wherein the first portion and the third portion each has a substantially uniform first thickness that is greater than a substantially uniform second thickness of the second portion, and wherein the first portion of the gate oxide layer is in a first dual-gate region.

* * * * *